United States Patent
Hegde et al.

(10) Patent No.: US 6,297,086 B1
(45) Date of Patent: Oct. 2, 2001

(54) APPLICATION OF EXCIMER LASER ANNEAL TO DRAM PROCESSING

(75) Inventors: Suryanarayan G. Hegde, Hollowville; Kam Leung Lee, Putnam Valley; Jack A. Mandelman, Stormville; Carl J. Radens, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/266,337

(22) Filed: Mar. 11, 1999

(51) Int. Cl.[7] ............................................. H01L 21/8242
(52) U.S. Cl. ...................... 438/243; 438/248; 438/249; 438/386; 438/391; 438/392
(58) Field of Search ............................ 257/301; 438/243, 438/248, 386, 391, 3, 240, 249, 392

(56) References Cited

U.S. PATENT DOCUMENTS

| | | | |
|---|---|---|---|
| 5,360,758 | 11/1994 | Bronner et al. | 438/243 |
| 5,395,786 | 3/1995 | Hsu et al. | 438/248 |
| 5,474,940 | * 12/1995 | Tsukamoto | 438/289 |
| 5,545,583 | 8/1996 | Lam et al. | 438/386 |
| 5,576,566 | 11/1996 | Kenney | 257/301 |
| 5,719,080 | 2/1998 | Kenney | 438/243 |
| 5,843,820 | * 12/1998 | Lu | 438/243 |
| 5,909,044 | * 6/1999 | Chakravarti et al. | 257/301 |
| 5,913,118 | * 6/1999 | Wu | 438/243 |
| 5,976,928 | * 11/1999 | Kirlin et al. | 438/240 |
| 5,998,821 | * 12/1999 | Hieda et al. | 257/301 |
| 6,043,528 | * 3/2000 | Aoki et al. | 257/301 |

FOREIGN PATENT DOCUMENTS

| | | |
|---|---|---|
| 06295923 | * 10/1994 | (JP) . |
| 11168194 | * 6/1999 | (JP) . |
| 2000091525 | * 9/1999 | (JP) . |

OTHER PUBLICATIONS

IBM Technical Disclosure Bulletin, "Vertical Dram Cell Structure Using Vertical Transistor in the Trench Capacitor," vol. 33, No. 3A, pp. 72–75 (1990).

* cited by examiner

*Primary Examiner*—Carl Whitehead, Jr.
*Assistant Examiner*—Toniae M. Thomas
(74) *Attorney, Agent, or Firm*—Scully, Scott, Murphy & Presser; Steven Capella, Esq.

(57) ABSTRACT

Excimer laser annealing is employed to improve the flexibility of gate activation and source/drain activation as well as to limit the extent of decomposition of a high dielectric constant storage capacitor in fabricating trench storage semiconductor memory devices.

20 Claims, 13 Drawing Sheets

APPLICATION OF EXCIMER LASER ANNEAL TO DRAM PROCESSING

RELATED APPLICATIONS

This application is related to co-pending and co-assigned U.S. application Ser. No. 09/152,835, filed Sep. 14, 1998.

FIELD OF THE INVENTION

The present invention relates to an improved method of fabricating a semiconductor memory device, and in particular to an improved method of fabricating a deep trench dynamic random access memory (DRAM) capacitor structure wherein an excimer laser anneal step is employed in activating the gate doping impurities and the source/drain diffusion regions of the structure. Under appropriate conditions, the excimer laser anneal step may substantially reduce the extent of decomposition of any temperature sensitive high dielectric constant material that may be used in fabricating the DRAM trench capacitor.

BACKGROUND OF THE INVENTION

In dynamic random access memory (DRAM) cell manufacturing, a key issue is the size of the overall cell. As the integration densities increase, it is desirable in the semiconductor industry to decrease the storage capacitor size while maintaining the charge storage capacity. One approach to this problem in the prior art is to utilize a deep trench capacitor. Such capacitor structures have reduced surface space while maintaining the charge storage capacity of the capacitor.

One problem associated with the formation of deep trench capacitors for semiconductor memory cells such as DRAMs is how to incorporate temperature sensitive high dielectric constant materials such as barium strontium titanium oxide (BSTO) into the storage node of the DRAM capacitor device.

Another problem associated with the formation of deep trench storage capacitors is the effect of the buried-strap outdiffusion on the array MOSFET electrical characteristics. Presently, DRAM technology falls into two main categories, use of stacked capacitor storage elements and use of deep trench storage capacitors. Each approach has certain advantages and disadvantages relative to each other. For example, deep trench technology results in improved planarization of the various layers of the structure which facilitates the ultra-fine lithographic and etching processes required for today's DRAMs.

FIG. 1 is a cross-sectional diagram showing the structure of a prior art DRAM cell 61 having a trench storage capacitor 60 and an array MOSFET 62. The DRAM cell 61 occupies an area of about $7F^2$ of the surface area of the DRAM IC, F being the minimum feature size which is photolithographically defined for features on the IC. The DRAM cell 61 is characterized by a design dimension 63 which is defined as the lateral distance between the near edge 64 of the trench storage capacitor 60 and the far edge 66 of the gate conductor 68. In an existing $7F^2$ DRAM cell design, this dimension 63 is designed to have a value of nominally 1.5 F, with the width of the gate conductor being 1.0 F and the nominal (designed) distance between the near edge of the gate conductor and the trench storage capacitor 60 being 0.5 F.

The most widely used trench storage DRAM technology utilizes a buried-strap (see FIG. 1) to form the connection between the array MOSFET and the storage capacitor 60. The buried-strap has a diffusion associated with it which extends vertically and laterally away from the interfacial opening between the trench storage capacitor 60 and the silicon substrate (see FIG. 1). The diffusion is formed by the outdiffusion of dopants (i.e. arsenic) from the N+ polysilicon in the storage trench into the adjacent single crystal silicon substrate. The depth and lateral extent of this buried-strap outdiffusion is highly detrimental to the scalability of the array MOSFET.

In past DRAM generations, when the state of the art minimum feature size, F, was larger than approximately 0.5 $\mu$m, the presence of the buried-strap outdiffusion did not pose much of an electrical problem for the array MOSFET. However, with present day DRAM designs approaching minimum feature size equal to 0.15 $\mu$m, and the typical buried-strap outdiffusion distance being greater than 50 nm from the interface between the N+ polysilicon in the deep trench, it is likely that the buried-strap outdiffused junction may extend under the gate conductor (wordline). This is likely to occur since, in addition to the large outdiffusion relative to the dimension 63, there is significant misalignment tolerance between the gate conductor and the deep storage trench. As shown in FIG. 1, the encroachment of the buried-strap outdiffusion upon the array MOSFET is characterized by the parameter $\delta$, which is the distance between the bitline (BL) diffusion and the buried-strap (BS) outdiffusion, expressed as a percentage of the trench edge to gate conductor edge dimension 63.

FIG. 2 illustrates how the device off-current increases with decreasing $\delta$. To assure that the off-current objective is met under all circumstances, the channel doping of the MOSFET must be raised. However, increased channel doping results in increased junction leakage and degraded device performance, thus degrading data retention time. Therefore, it is highly desirable to make the value of $\delta$ as large as possible to minimize these deleterious effects.

The distance between the bitline diffusion and the buried-strap diffusion is determined by the layout groundrules, process tolerances (overlay and feature size) and the amount of buried-strap outdiffusion from the trench storage capacitor. This critical distance is illustrated by the parameter $\delta$ in the prior art deep trench DRAM cell shown in FIG. 1. The amount of buried-strap outdiffusion is principally determined by the thermal budget that the buried-strap encounters in the course of the chip fabrication process. The thermal budget is a function of the square root of the sum of the products of the diffusivity, D, of the strap dopant impurity and the effective amount of time spent at each high temperature step which contributes significantly to the diffusion.

For prior art deep trench storage capacitor DRAM cells, the high temperature processing steps which contribute to the strap outdiffusion from the storage capacitor polysilicon typically consist of STI oxidation, STI densification, gate sacrificial oxidation, transfer gate oxidation, gate conductor sidewall oxidation, and junction anneals. The combined thermal budget of these high temperature processes results in an arsenic outdiffusion from the storage trench polysilicon into the silicon substrate which typically ranges from 50 to 100 nm. This means that for high-density trench DRAM cell designs having a minimum feature size of 1.5 $\mu$m, the distance $\delta$ typically ranges from 0.08 to 0.13 $\mu$m; $\delta$ typically ranges from 35% to 60% of the design distance between the storage trench edge and the far edge of the gate conductor, for prior art DRAM cells having a layout area of 7 minimum features squared ($7F^2$) per bit and a minimum feature size, F, equal to 0.15 $\mu$m. As seen from FIG. 2, the off-current can vary by more than 100× over this range of variation in $\delta$.

In a possible fabrication approach, a deep trench is first formed in a semiconductor substrate or wafer and then the deep trench is filled with a temperature sensitive high dielectric constant material. After filling the deep trench with the temperature sensitive high dielectric constant material, shallow trench isolation (STI) regions and gate conductor (GC) stacks are typically formed. A problem with such an approach is that the high temperatures used in fabricating the STI regions and the GC stacks adversely affect the temperature sensitive high dielectric constant material used in filling the deep trench and contribute to the buried-strap outdiffusion. Specifically, the length of time at the high processing temperatures employed in fabricating the STI regions and the GC stacks cause decomposition of the temperature sensitive high dielectric constant material and add to the thermal budget of the strap outdiffusion. The high dielectric material and its by-products thus formed may diffuse and interact with the underlying semiconductor material.

A partial solution to the above problem has been provided in related application U.S. Ser. No. 09/152,835, filed Sep. 14, 1998. This application shows how to fabricate a DRAM array such that the deep trench storage node is formed after the hot processing steps of STI oxidation and anneal. Although a significant fraction of the thermal budget is removed from the temperature sensitive high dielectric constant material, the annealing processes disclosed in the related application do not allow sufficient flexibility in the gate doping and source/drain diffusion activation anneal conditions which may be necessary to achieve desirable device characteristics, i.e. low leakage and an electrically active-low resistivity gate conductor.

To avoid the problem of capacitor insulator degradation mentioned above, the prior art in stacked capacitor DRAM technology utilizes a thin electrically conductive barrier layer comprising a material such as TiN, TiAlN, TaSiN and CoSi between the temperature sensitive high dielectric constant material and the semiconductor material, e.g. silicon. The presence of such a barrier layer in semiconductor memory devices, while prohibiting oxygen diffusion from occurring, adds additional processing steps and costs to the overall semiconductor memory device manufacturing process.

On top of this conductive barrier layer, the prior art in stacked capacitor DRAM technology typically deposits a thin layer of a conductive material so as to form a bottom electrode. This conducting layer, in the case of high dielectric constant capacitors, is composed of conductive oxides such as $RuO_2$, $SrRuO_3$, La—Sr—Co—O and $IrO_2$, or by metals like Pt or Ir. One advantage of $SrRuO_3$ is that it can be directly deposited on silicon with minimum or no oxidation underneath. A high dielectric constant material can then be deposited on top of the electrode layer to a desired thickness.

Finally, for the top electrodes, material similar to the bottom electrode is typically selected. If it is desired to use a polysilicon or amorphous silicon overlayer, a thin layer of a barrier material, as discussed above, can be deposited to prevent undesirable reactions between silicon and the electrode material before chemical vapor deposition (LPCVD) of amorphous/polysilicon.

In view of the drawbacks with prior art DRAM stacked capacitor structures in using temperature sensitive high dielectric constant material, it would be beneficial if a new process of fabricating a trench DRAM capacitor structure having a temperature sensitive high dielectric constant material incorporated into the storage node of the DRAM capacitor structure was developed which overcomes all of these drawbacks. New and improved methods of fabricating such trench DRAM structures are especially needed in order to provide flexibility in gate doping and source/drain anneal conditions which achieve desirable device characteristics as well as minimizing the amount of outdiffusion from the buried-strap in a MOS DRAM array.

SUMMARY OF THE INVENTION

One object of the present invention is to provide a process of fabricating a trench capacitor semiconductor memory device which contains a temperature sensitive high dielectric constant material as the storage node material.

Another object of the present invention is to provide a process of fabricating such a trench storage capacitor semiconductor memory device wherein the gate activation and source/drain activation anneals do not damage the temperature sensitive high dielectric constant material which is present in the trench capacitor region.

A further object of the present invention is to provide a process which results in a limited buried-strap outdiffusion, whose deleterious electrical effects on the array MOSFET are reduced from the prior art.

Still another object of the present invention is to provide a desirable buried-strap junction gradient profile.

These as well as other objects and advantages can be achieved in the present application by using an excimer laser anneal step which is capable of not only activating the gate region as well as the source/drain regions, but limiting the buried-strap or surface strap outdiffusion. Specifically, the process of the present invention comprises the steps of:

(a) providing an intermediate trench capacitor structure comprising a trench storage capacitor formed partially within a semiconductor substrate or wafer and a patterned gate region formed on said semiconductor substrate or wafer, wherein said trench storage capacitor comprises at least a lower region having a temperature sensitive material situated between a bottom electrode and a top electrode;

(b) forming source/drain diffusion regions in said semiconductor substrate or wafer in areas adjacent to said patterned gate region;

(c) annealing the structure of step (b) using an excimer laser under conditions effective to activate the source/drain diffusion regions without substantially degrading the temperature sensitive material in said lower region of said trench storage capacitor;

(d) forming an insulating layer over said structure of step (c):

(e) planarizing said insulating layer; and (f) forming borderless diffusion contacts on said semiconductor substrate or wafer.

In embodiments wherein the trench storage capacitor contains a region of doped polysilicon, the excimer laser anneal step may cause limited outdiffusion of the dopant from the trench storage capacitor forming a buried-strap or surface strap of limited outdiffusion.

The excimer laser anneal step may be carried out using a single-pulse or a series of pulses which are separated by short durations of time. A laser operating at 308, 193 or 248 nm can be employed in the present invention, with the 308 nm laser being highly preferred.

To contain the melt depth in Si produced by the laser pulses to be less than a depth of 10 nm from the Si surface for all three possible laser sources (308, 193 or 248 nm) requires a very short thermal pulse (less than about 1 microsecond). This short heating cycle has the added benefit of much higher electrical activation of the dopants than in the case of conventional rapid thermal annealing (RTA). This enhanced electrical activation is due to the fact that the ultra-fast heating and cooling cycle of the laser annealing process avoids some of the deactivation mechanisms of dopant clustering and precipitation.

In the subject application, operation of the laser annealing just below the melting threshold is desirable since it results in graded junctions with reduced electrical field in the junction depletion region. This feature is particularly suited for buried-strap diffusion from the deep trench, wherein high field gradients can lead to unacceptably low DRAM retention times via field induced leakage currents.

In the present invention, the formation of the trench storage capacitor follows the formation of the STI region. This means that the prior art high-temperature processing steps which include STI oxidation, STI densification, gate sacrificial oxidation, and transfer gate oxidation are not seen by the buried-strap or surface strap outdiffusion. Moreover, the employment of an excimer laser anneal step rather than conventional annealing provides a controlled means of activating the gate doping and source/drain diffusion regions without degrading the temperature sensitive high dielectric constant material of the trench storage capacitor.

Elimination of these high temperature steps from the thermal budget of the strap outdiffusion typically results in a reduction of thermal budget of greater than 50%. This reduction of thermal budget translates into a reduction of strap outdiffusion which is typically greater than 30% of the outdiffused distance which results from the prior art process. This reduction in strap outdiffusion, which is typically less than 50 nm, results in a substantial increase in the parameter $\delta$, which results in reduced off-current for a given channel doping concentration. In the present invention $\delta$ is always greater than that of the prior art structures. For the inventive structure, $\delta$ is typically 50% to greater than 75% of the design distance between the storage trench edge and the far edge of the gate conductor, for a $7F^2$ cell with F=0.15 $\mu$m.

DETAILED DESCRIPTION OF THE INVENTION

Figure 1:
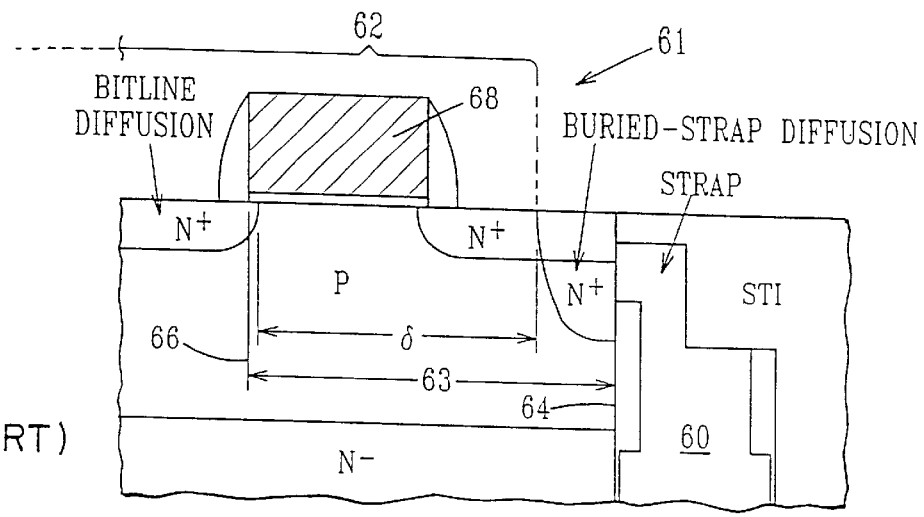
FIG. 1 is a cross-sectional view of a prior art trench storage DRAM structure.
Figure 2:
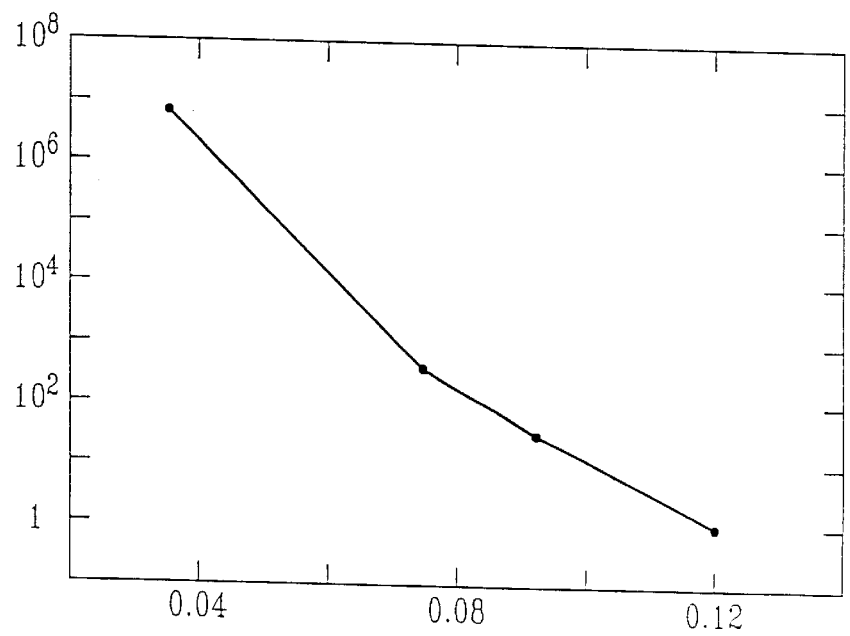
FIG. 2 is a graph of modeled sensitivity of device off-current to distance outdiffusion and bitline diffusion, $\delta$.

The present invention, which provides a process of fabricating a trench capacitor memory device having a temperature sensitive material incorporated into the storage node of the capacitor, will now be described in greater detail by referring to the drawings that accompany this application. It is noted that in the various drawings like elements or components are referred to by like and corresponding reference numerals.

Figure 8:
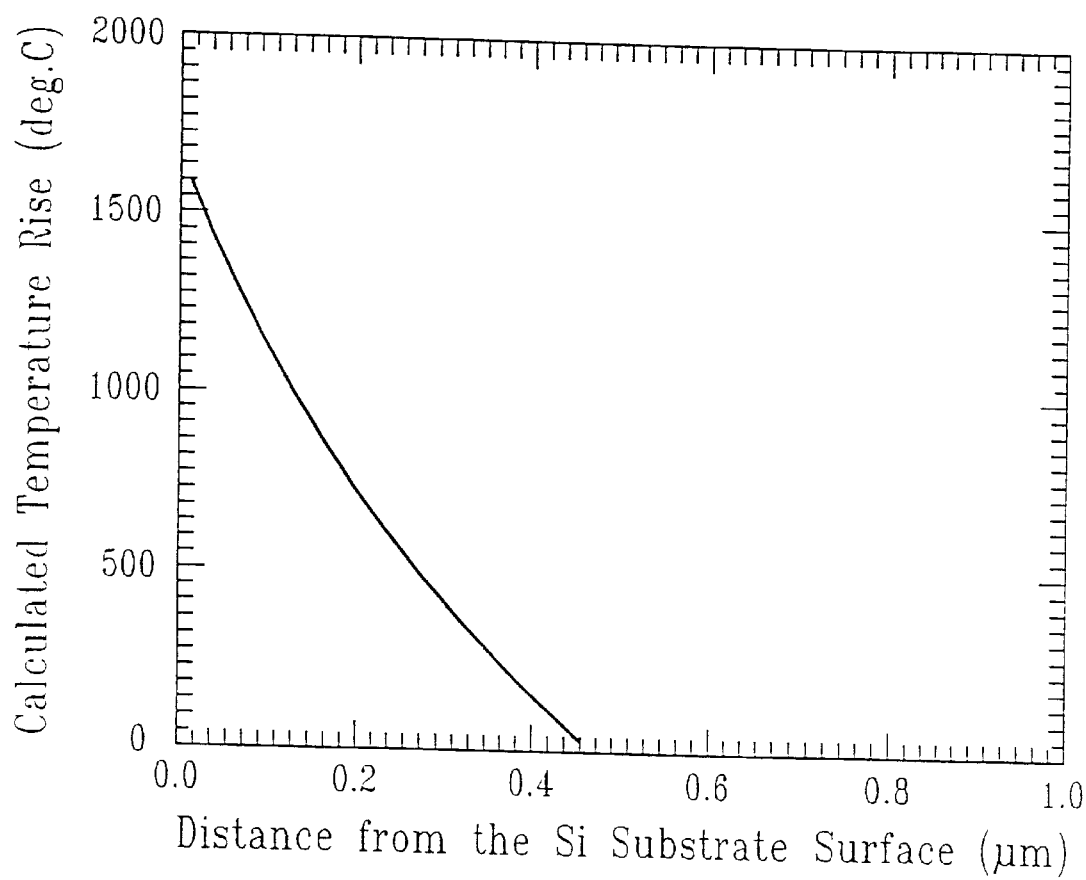
FIG. 8 is a graph plotting calculated temperature rise (°C.) vs. distance from the Si surface ($\mu$m) for a 308 nm excimer laser (laser fluence=0.7 J/cm$^2$; pulse duration =40 ns.

It is emphasized that the present invention provides an improved method over what is disclosed in the above-referenced related application in that it provides a more flexible means of activating the source/drain regions without causing any substantial damage to the temperature sensitive material incorporated in the storage node of the capacitor. The related application mentioned above uses conventional annealing conditions to activate the source/drain regions. Applicants have unexpectedly determined that by using excimer laser annealing, rather than conventional annealing, a more controlled means for activating the source/drain regions and limiting the strap outdiffusion (buried or surface) can be obtained. Without wishing to be bound by any theory, the improved control is achieved in the present invention by limiting the amount of heat in the annealing step to within a short distance from the surface of the semiconductor substrate or wafer. Such controlled heating, which is shown in FIG. 8, for example, cannot be obtained using conventional annealing processes.

Figure 3:
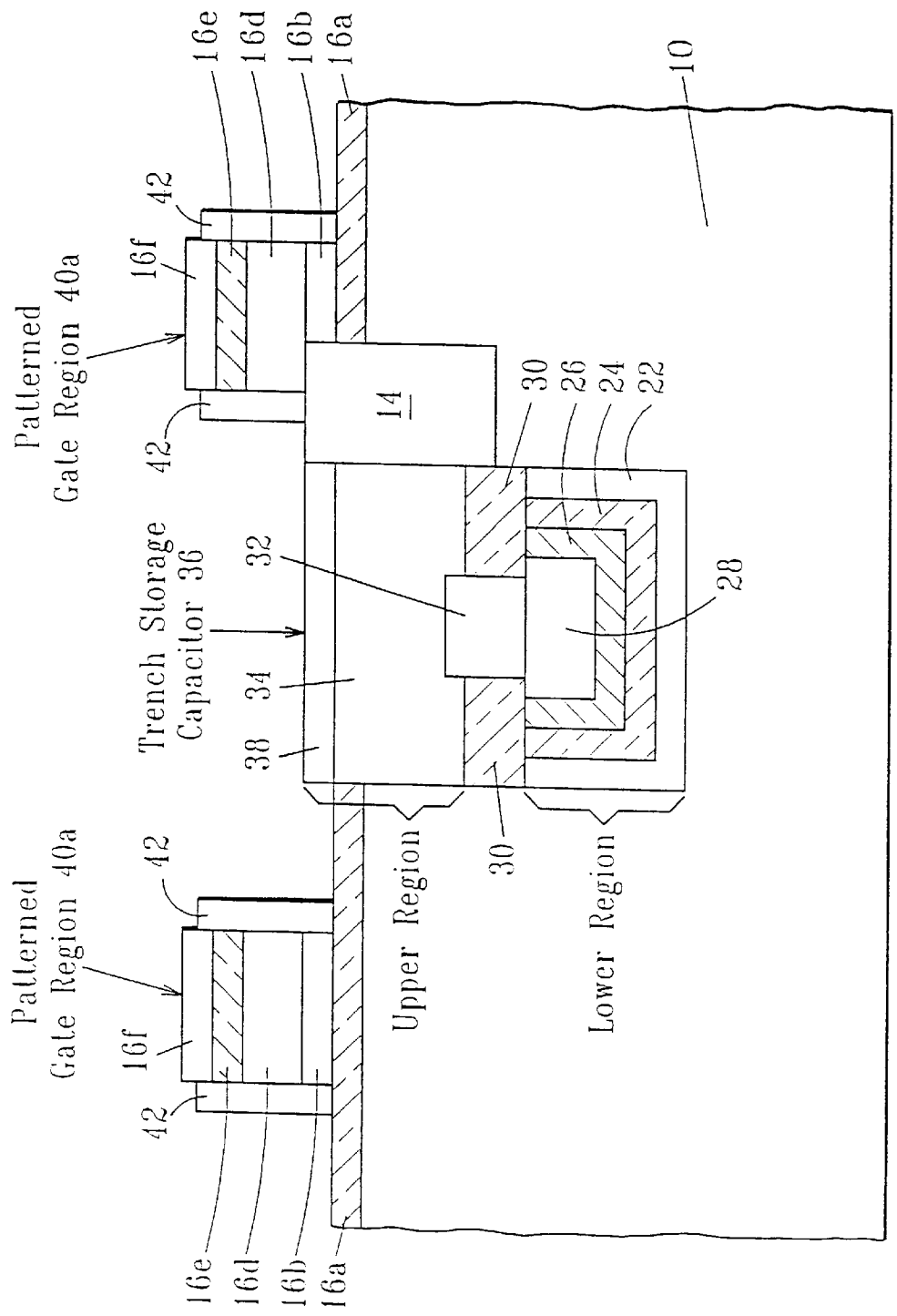
FIG. 3 is an intermediate trench capacitor semiconductor structure which can be employed in the present invention.

In accordance with the present invention, an intermediate trench capacitor structure as shown in FIG. 3 is first provided. The intermediate structure comprises a trench storage capacitor and a patterned gate region. The trench storage capacitor which is formed partially within a semiconductor substrate or wafer 10 comprises at least a lower region which contains temperature sensitive material 24 situated between bottom electrode 22 and top electrode 26. This lower region further contains a doped or undoped polysilicon region 28 which fills the middle region of the trench.

The upper region of the trench storage capacitor contains polysilicon regions 32 and 34 and a trench top oxide dielectric film 38. Collar oxides 30 separate the upper region of the trench storage capacitor from the lower region.

The patterned gate region shown in FIG. 3 comprises a stack containing a layer of polysilicon 16b, another layer of polysilicon 16d, a salicide layer 16e and a cap layer 16f. The patterned gate region is formed on a gate oxide 16a and it may also contain sidewall spacers 42.

This intermediate structure shown in FIG. 3 is prepared using the processing steps mentioned in co-pending and co-assigned U.S. application Ser. No. 09/152,835, the contents of which are incorporated herein by reference. Specifically, the intermediate structure of FIG. 3 is formed as shown in FIGS. 4(a)–(k). The exact processing steps include the following: First, attention is directed to FIG. 4(a) which shows an initial semiconductor structure which is employed in the present invention. Specifically, the semiconductor structure shown in FIG. 4(a) comprises a semiconductor substrate or wafer 10 having at least one storage trench region 12 and a raised shallow trench isolation (STI) region 14 adjacent to storage trench region 12 formed therein. The structure further comprises preformed layers 16 of a partial gate conductor stack formed thereon which are spaced apart by storage trench region 12 and raised STI region 14.

Semiconductor substrate or wafer 10 is composed of any semiconducting material including, but not limited to: Si, Ge, SiGe, GaAs, InAs, InP and all other III/V compounds. Of these semiconducting material, it is preferred that semiconductor substrate or wafer 10 be composed of Si. The semiconductor substrate or wafer may be of the p-type or the n-type depending on the type of semiconductor memory device being manufactured.

Figure 4A:
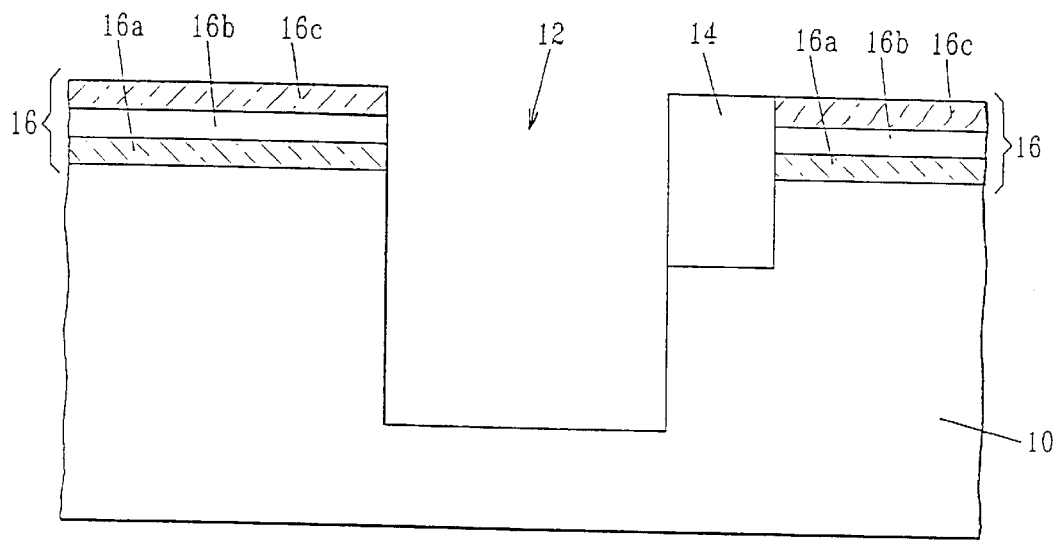
FIGS. 4(a)–(k) show the various processing steps that are employed in the present invention in fabricating the intermediate structure shown in FIG. 3.

The preformed layers of the partial gate conductor shown in FIG. 4(a) are composed of a bottom gate oxide layer 16a such as $SiO_2$, a middle layer of polysilicon 16b and a top polish stop layer 16c such as $Si_3N_4$. The layers are formed sequentially on the surface of the semiconductor substrate or wafer starting with layer 16a, then 16b and finally 16c.

Figure 5A:
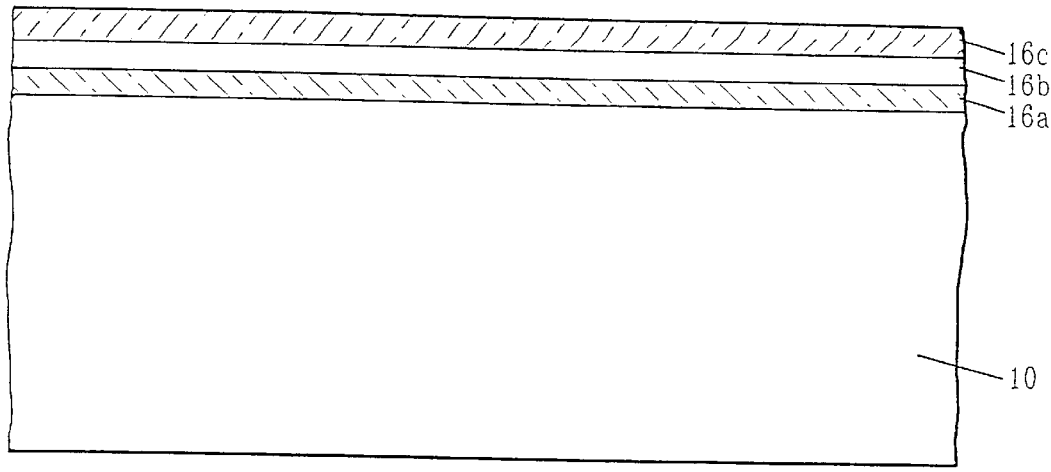
FIGS. 5(a)–(d) show the various processing steps that are employed in fabricating the initial structure shown in FIG. 4(a).

The structure shown in FIG. 4(a) is fabricated using conventional techniques well known to those skilled in the art. For example, the structure shown in FIG. 4(a) can be fabricated as is shown in FIGS. 5(a)–(d). Specifically, as is shown in FIG. 5(a), a semiconductor substrate or wafer 10 is first provided and gate oxide layer 16a is grown on the surface of semiconductor substrate or wafer 10 using conventional thermal growing techniques well known to those skilled in the art. This includes heating the semiconductor substrate or wafer in an oxygen ambient at a temperature of from about 800° to about 1100° C. until a gate oxide having a thickness of from about 4 to about 10 nm is formed on the surface of the semiconductor substrate or wafer.

Next, a layer of polysilicon 16b is formed on the surface of gate oxide 16a using standard deposition techniques well known to those skilled in the art. Suitable deposition processes that may be employed in forming polysilicon layer 16b include, but are not limited to: chemical vapor deposition, plasma vapor deposition, low pressure chemical vapor deposition, high density chemical vapor deposition and other like deposition processes.

The thickness of the polysilicon layer formed is typically in the range of from about 10 to about 500 nm.

Polish stop 16c is then formed on polysilicon layer 16b using standard deposition techniques, including those mentioned above, that are well known to those skilled in the art. The polish stop is composed of a conventional material such as $Si_3N_4$ which resists erosion during subsequent planarization and etching steps. The thickness of the polish stop layer formed is typically of from about 10 to about 500 nm.

Figure 5B:
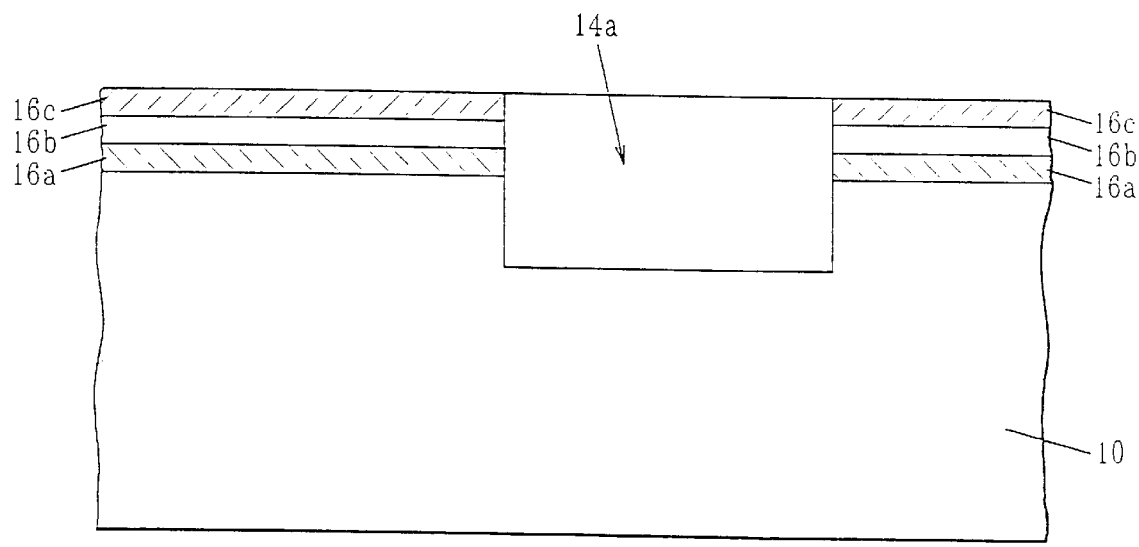

The next step illustrated in FIG. 5(b) shows a structure which contains a trench 14a which is formed in layers 16a, 16b, and 16c as well as the surface of semiconductor substrate or wafer 10. It is noted that trench 14a is used in forming STI region 14. The structure of FIG. 5(b) is fabricated using standard lithography, etching and planarization, all of which are well known to those skilled in the art.

Specifically, the structure shown in FIG. 5(b) is fabricated by providing a conventional resist having a preformed pattern on top of layer 16c of the structure shown in FIG. 5(a) using standard deposition techniques which include spin-on coating and dip coating. The pattern is then etched by standard etching techniques well known to those skilled in the art through layers 16c, 16b, 16a as well as into semiconductor substrate or wafer 10. Suitable etching techniques that can be employed include, but are not limited to: reactive ion etching (RIE), plasma etching and ion beam etching. The depth that etching is performed into the semiconductor substrate or wafer is typically of from about 100 to about 700 nm. It should be noted that the resist is removed at this time using conventional stripping techniques well known to those skilled in the art.

A thermal silicon dioxide layer, not shown in the drawings, is then grown in the trench of the raised STI region using conventional thermal growing techniques, including the use of an oxygen-containing ambient and heating to a temperature of from about 750° to about 1100° C. The thickness of the grown silicon dioxide layer in trench 14a is typically of from about 3 to about 30 nm. A STI dielectric, not shown in the drawings, is then formed over the thermal silicon dioxide layer using standard deposition techniques such as low pressure chemical vapor deposition or a plasma-assisted process. Suitable STI dielectrics include, but are not limited to: high density plasma tetraethylorthosilicate (HDP TEOS) oxide. It should be noted that in the drawings of the present invention, the above two components, i.e. thermal silicon dioxide layer and STI dielectric are not shown. Instead, STI region 14 is meant to include those two components as well as others that may be present in a conventional STI region.

To provide a planar structure, as is shown in FIG. 5(b), the structure is then planarized using standard planarization techniques well known to those skilled in the art, including, but not limited to: chemical mechanical polishing, RIE and grinding.

Figure 5C:
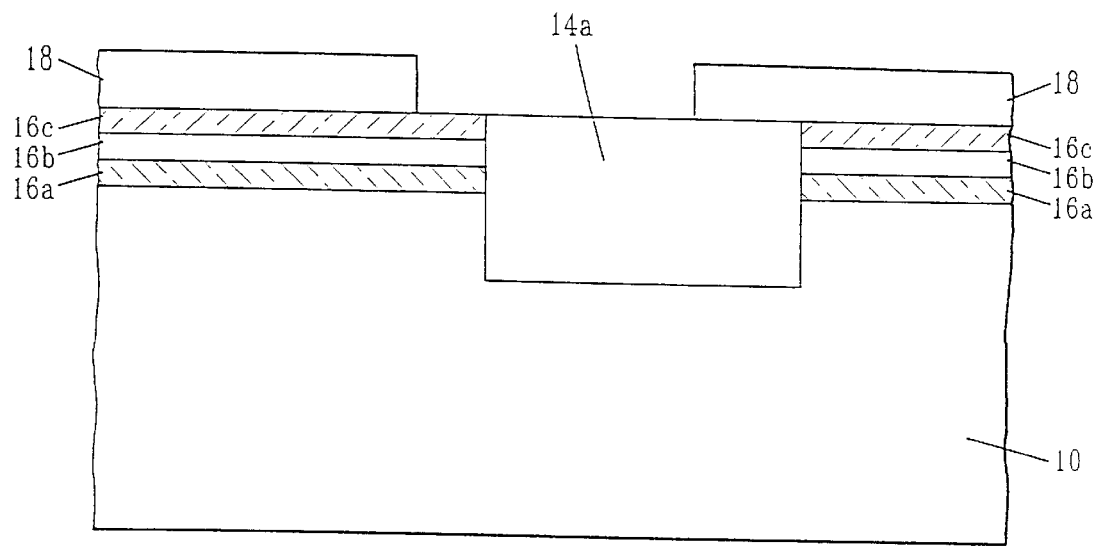

FIG. 5(c) shows the next steps employed in fabricating the structure illustrated in FIG. 4(a). Specifically, to the planarized structure of FIG. 5(b) there is formed a hard dielectric mask layer 18, e.g. boron doped silicon dioxide (BSG), which is then patterned utilizing standard lithography techniques and reactive ion etched to remove a portion of the hard dielectric mask. The patterned structure is shown in FIG. 5(c).

Figure 5D:
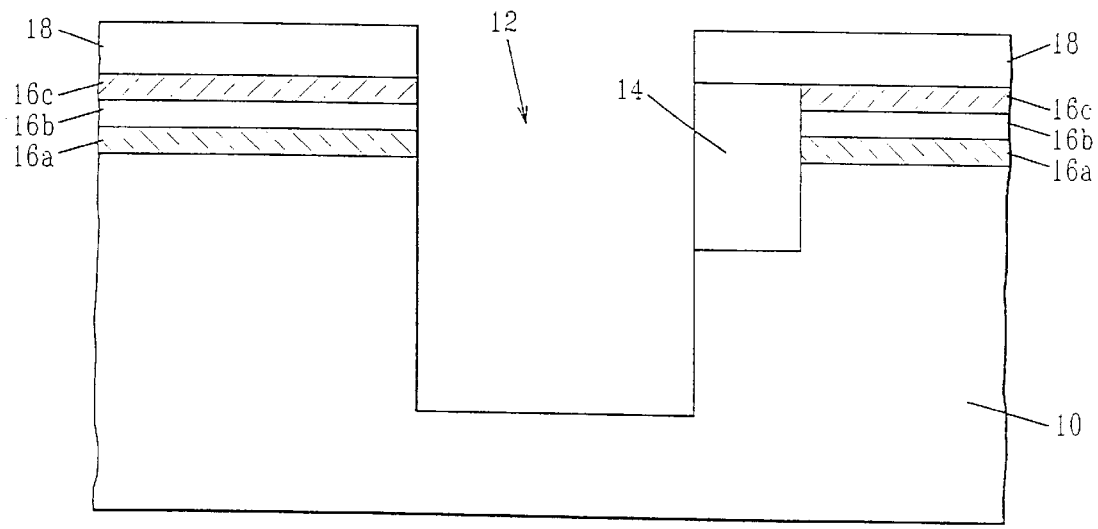

Next, storage trench 12 is formed in semiconductor substrate or wafer 10 using hard dielectric layer 18 as a masking film. Specifically, RIE using reactive gases such as HBr, $NF_3$, $O_2$ or He is employed in fabricating storage trench 12. By "storage trench" it is meant that etching is performed to a depth of from about 1 to about 10 μm. The structure containing storage trench 12 which forms the capacitor region of the device is shown in FIG. 5(d). Hard dielectric mask 18 is then removed by an HF-etching process to provide the structure shown in FIG. 4(a).

It is again emphasized that the above description provides one way of fabricating the structure shown in FIG. 4(a). Other ways of fabricating the structure shown in FIG. 4(a) are also known and are thus contemplated herein.

Figure 4B:
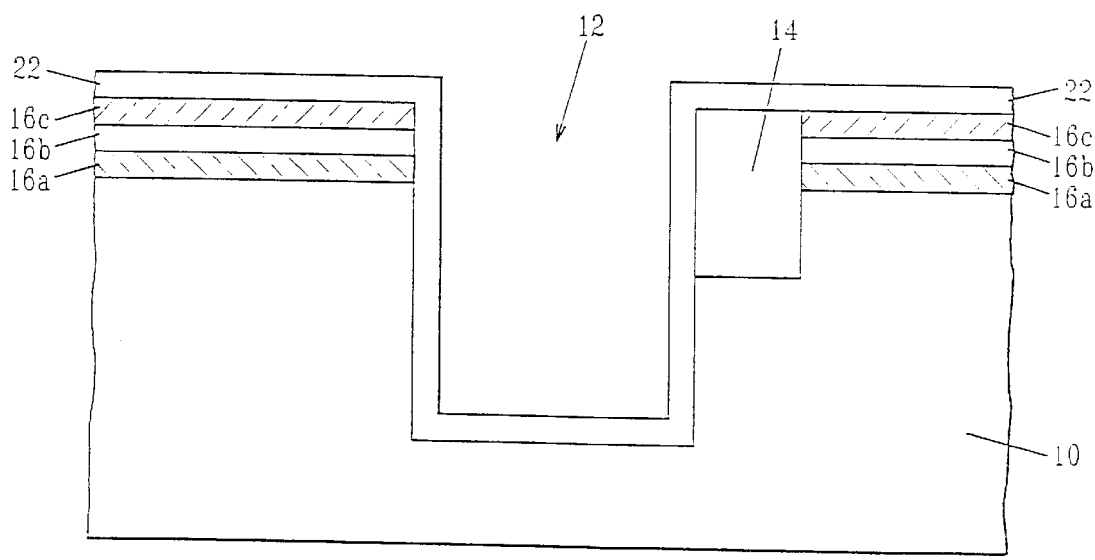
Figure 4C:
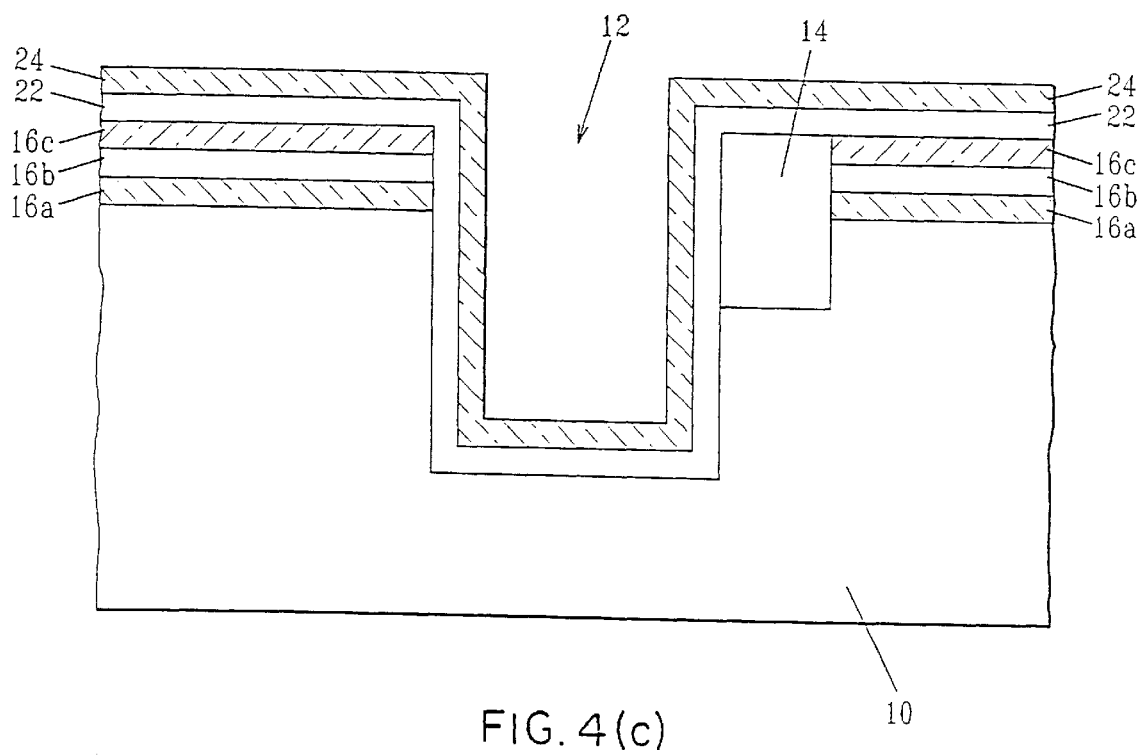
Figure 4D:
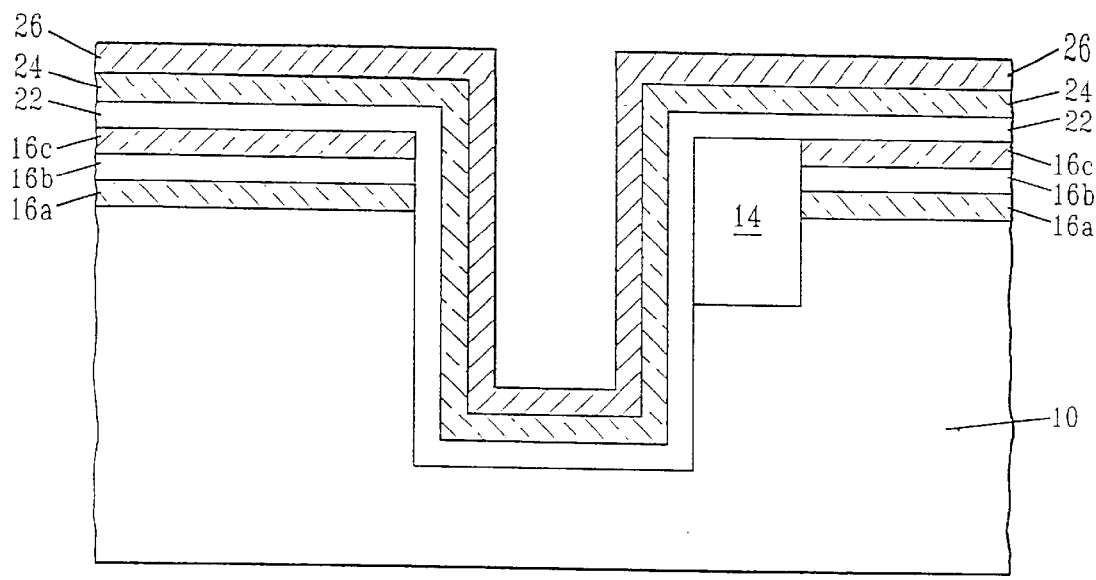
Figure 4E:
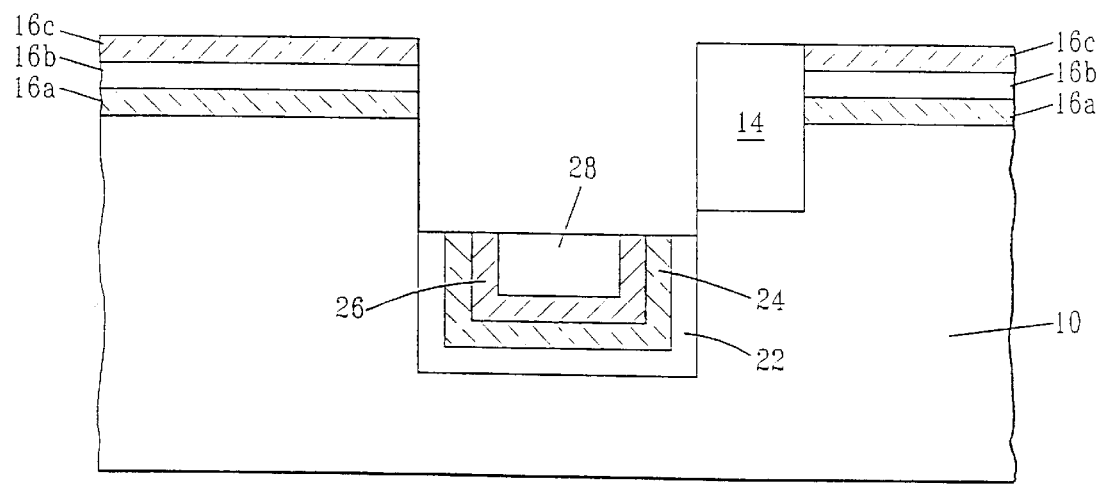
Figure 4F:
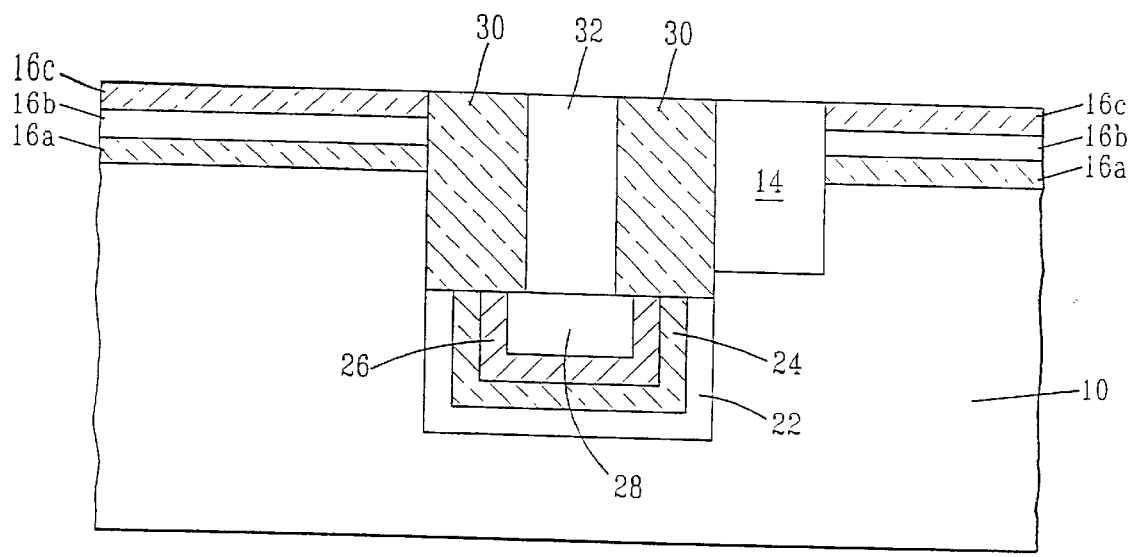
Figure 4G:
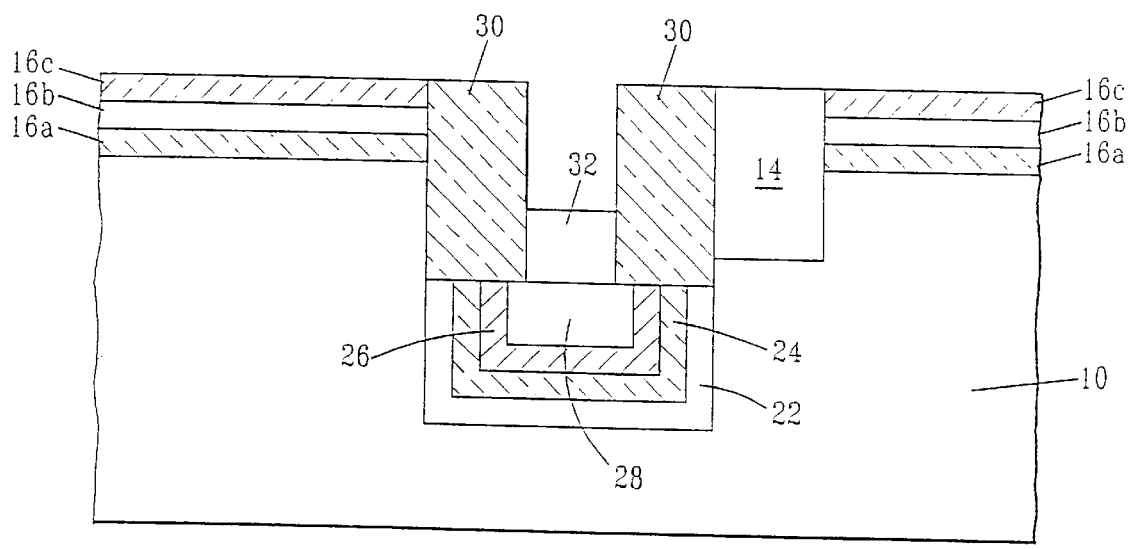
Figure 4H:
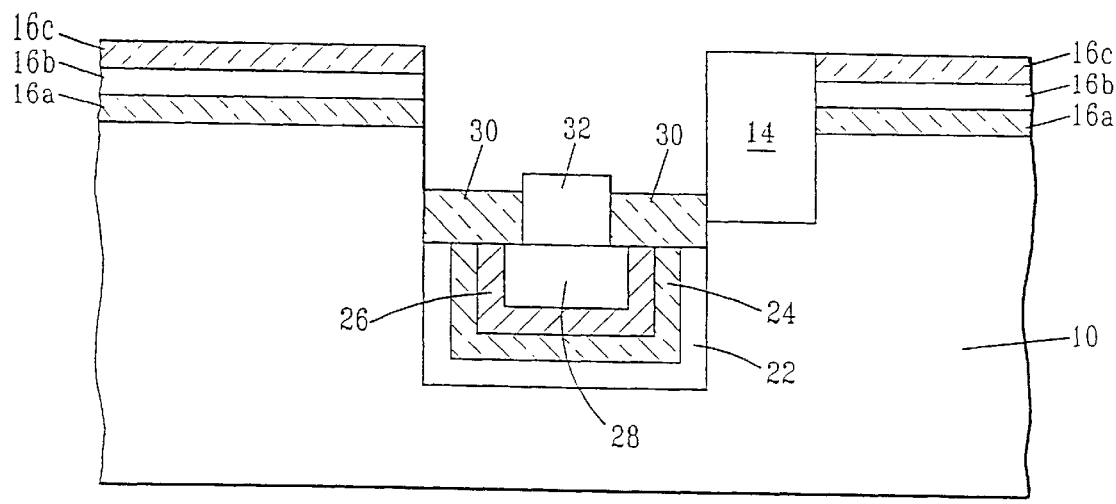
Figure 4I:
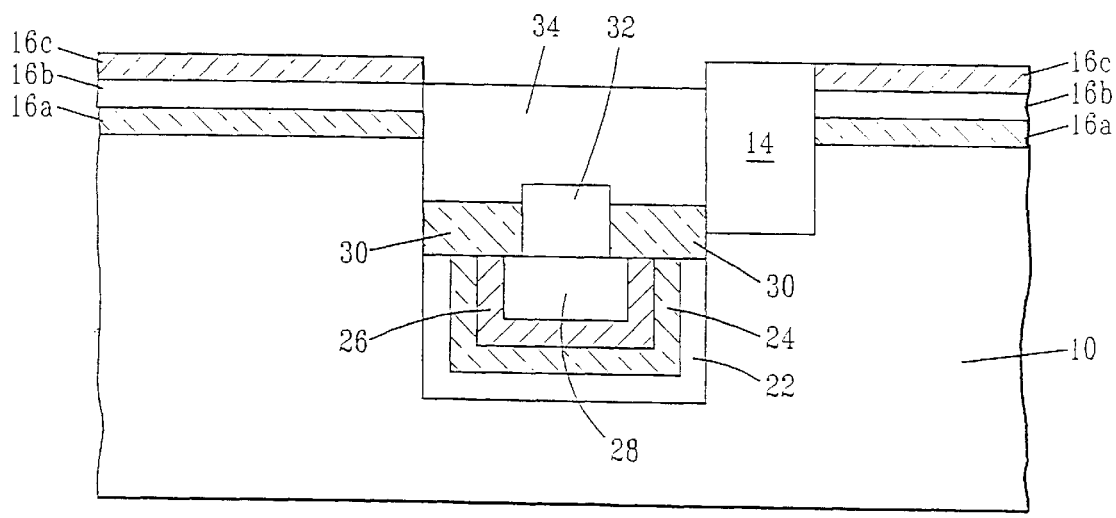
Figure 4J:
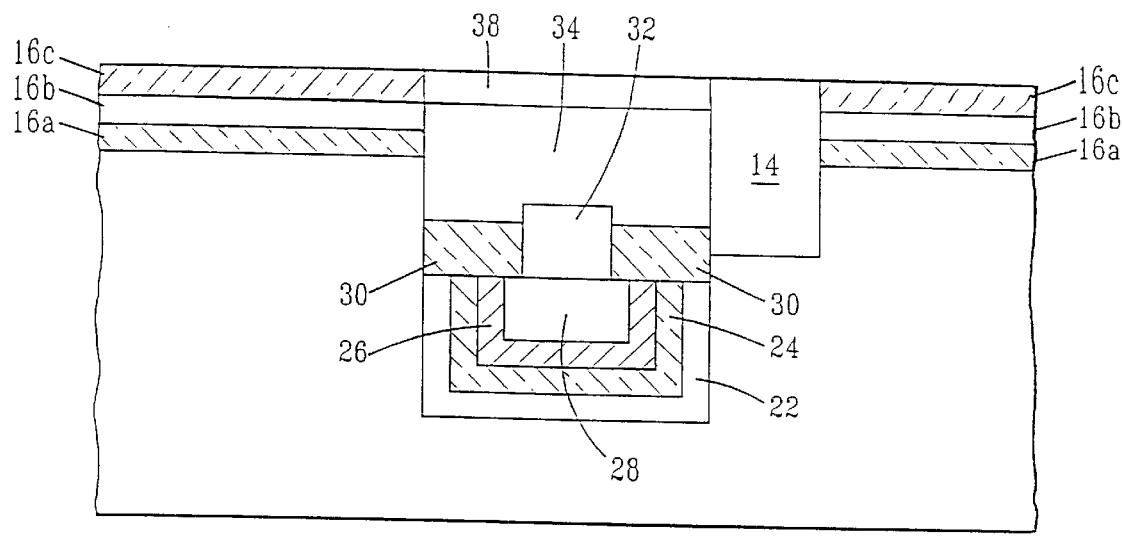
Figure 4K:
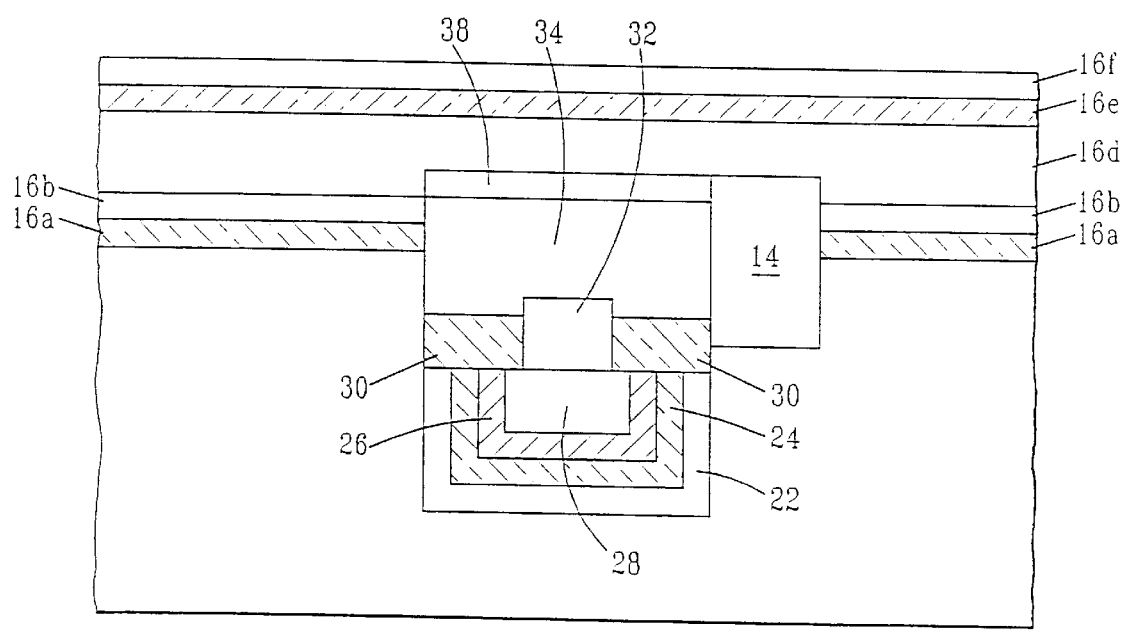

In accordance with the next step used in forming the intermediate structure of the present invention, a bottom electrode 22 is then formed in storage trench 12 (bottom wall, sidewalls as well as areas outside the deep trench) using conventional deposition techniques well known to those skilled in the art. For example, bottom electrode 22 can be formed by chemical vapor deposition, metallo-organic chemical vapor deposition, electroplating or electrodeless plating. The material employed in forming bottom electrode 22 includes any conductive oxide which is typically used as a bottom electrode of a capacitor. Exemplary conductive oxides include, but are not limited to: $RuO_2$, $SrRuO_3$, La—Sr—Co—O, $IrO_2$ and other like conductive oxides. In addition to conductive oxides, metals such as Pt or Ir can also be used as the bottom electrode. The intermediate structure containing bottom electrode 22 is shown in FIG. 4(b).

Optionally, a diffusion barrier layer is formed in the storage trench prior to forming bottom electrode 22. Suitable diffusion barrier layers that can be optionally employed in the present invention include, but are not limited to: TiN, TiAlN, TaSiN, CoSi and other like materials which are capable of preventing the diffusion of oxygen into the semiconductor substrate or wafer. Chemical vapor deposition or physical vapor deposition are two deposition processes that can be employed in the present invention in forming the optional diffusion barrier layer.

After formation of bottom electrode 22, a layer of a temperature sensitive high dielectric constant material 24 is formed on the surface of the bottom electrode, see FIG. 4(*c*). The term "temperature sensitive" is used herein to denote a material which when in contact with silicon and heated to temperatures over 600° C. oxidizes the silicon and degrades by reacting with silicon or by breaking up into other compounds. The temperature sensitive high dielectric constant material utilized herein is however not in direct contact with silicon. It nevertheless becomes unstable by itself at temperatures of about 550° C. and above. On the other hand, the term "high dielectric constant material" denotes a material which has a dielectric constant relative to a vacuum higher than about 7. More preferably, the high dielectric constant material employed in the present invention has a dielectric constant of from about 20 to about 10,000.

Suitable temperature sensitive high dielectric constant materials that can be employed in the present invention include perovskite-type oxides such as barium strontium titanium oxide (BSTO), lead zirconium titanium oxide (PZTO), strontium bismuth tantalate (SBT) and $Ta_2O_5$. The temperature sensitive high dielectric constant material is formed on bottom electrode 22 using standard deposition processes including chemical vapor deposition or sputtering.

A top electrode 26 is then formed on top of temperature sensitive material 24 utilizing standard deposition techniques such as chemical vapor deposition. The top electrode may be composed of the same or different conductive oxide as the bottom electrode. Thus, top electrode 26 may be composed of $RuO_2$, $SrRuO_3$, La—Sr—Co—O and $IrO_2$. Alternatively, Pt or Ir can be employed. The structure containing top electrode 26 is shown in FIG. 4(*d*).

Optionally, a conducting barrier layer is formed over top electrode 26 prior to filling the trench with polysilicon 28. This conducting barrier layer which is formed by conventional deposition processes serves to prevent interaction between the temperature sensitive high dielectric constant material and the polysilicon. TiN, TiAlN, CoSi and TaSiN are some examples of conducting barrier layers that may be employed in the present invention. For clarity, the conducting barrier layer is not shown in the drawings.

The remaining portion of the storage trench is filled with polysilicon 28, preferably n+ doped polysilicon, using standard deposition processes and then the polysilicon is recessed using a dry etch containing gas such as $SF_6$, He, $O_2$ or $NF_3$ to a depth of from about 0.5 to about 1.5 μm. The exposed portion of the previously formed layers 22, 24, 26 are then removed using isotropic etching. The structure obtained from these combined steps of the present invention is shown in FIG. 4(*e*).

Next, as is shown in FIG. 4(*f*), a conformal insulating collar oxide 30 is then formed over the semiconductor substrate or wafer 10 and the sidewalls of storage trench 12 which were again left exposed by the above recess process. The conformal insulating collar oxide is formed by conventional deposition processes such as low pressure chemical vapor deposition or plasma-assisted chemical vapor deposition to a thickness of from about 10 to about 30% of the storage trench diameter. Dry etching using an anisotropic removal processing gas such as $C_4F_8$, $CH_3F$, $CF_4$, $C_3F_8$, CO, $O_2$ or Ar is then employed so as to etch material from the wafer plane and the bottom of storage trench 12, but leaving material along the sidewalls of the storage trench. The trench is then filled with low pressure chemical vapor deposited polysilicon 32 which may or may not be doped and planarized utilizing a dry etch or chemical mechanical polishing process.

As shown in FIG. 4(*g*), the low pressure chemical vapor deposited polysilicon is then recessed to a predetermined depth, e.g. 20 to 50 nm, utilizing a dry etch process such as previously described hereinabove. The collar dielectric is then removed using a HF containing etch from upper regions of the storage trench, See FIG. 4(*h*).

The next steps employed in the present invention in completing the fabrication of the capacitor in the storage trench, which is shown in FIG. 4(*i*), comprise depositing a low pressure chemical vapor deposition polysilicon layer 34 which may or may not be doped over the structure and then recessing using an anisotropic dry etch process containing gases such as HBr, $Cl_2$, HCl, $SF_6$, He or $O_2$ to a depth of from about 5 to about 30 nm below the surface of semiconductor substrate or wafer 10.

Capacitor 36 is then completely fabricated in the storage trench by forming a trench top oxide (TTO) dielectric film 38 and planarizing to the top of layer 16*c*, See FIG. 4(*j*). The TTO dielectric film is formed by conventional deposition processes including low pressure chemical vapor deposition or plasma enhanced chemical vapor deposition and planarization is carried out using one of the previously mentioned planarization techniques, e.g. chemical mechanical polishing.

FIG. 4(*k*) shows a structure which includes a completely formed gate conductor stack which includes preformed gate conductor layers 16*a* and 16*b*, as well as a polysilicon layer 16*d*, a salicide layer, i.e. WSi, 16*e* and cap layer, $Si_3N_4$, 16*f*. Polysilicon layer 16*d* is formed using the same deposition techniques as is described for polysilicon layer 16*b*. Layer 16*e* is formed by chemical vapor deposition or sputtering and it has a thickness of from about 20 to about 200 nm. In regard to cap layer 16*f*, that layer is formed by low pressure chemical vapor deposition and it has a final deposited thickness of from about 20 to about 300 nm. It should be noted that barrier layer 16*c* is removed prior to depositing layers 16*d, e* and *f*.

The various gate stack layers are then patterned using conventional lithography and a RIE dry etch process stopping in gate oxide layer 16*a* and the TTO/STI oxide providing the intermediate structure of FIG. 3. A gate sidewall oxidation may be done by a conventional process. Sidewall spacers 42, e.g. $Si_3N_4$, are formed over the patterned gate conductor stack 40*a* using deposition techniques well known to those skilled in the art.

Source/drain regions 50 and 50A are then formed in the intermediate structure of FIG. 3 using conventional ion implantation. In the prior art, conventional annealing is used to activate the gate doping and the source/drain regions. Conventional annealing uses temperatures and times which may cause damage to the temperature sensitive material. To avoid this, applicants have unexpectedly determined that an excimer laser anneal could be used in place of conventional annealing. The excimer laser provides sufficient energy in terms of heat required to activate the gate doping and source/drain regions, yet the energy is insufficient to degrade the temperature sensitive material. This is so since the excimer laser anneal step employed in the present invention provides controlled heating of the substrate which is limited to a depth of less than about 0.4 $\mu$m, See FIG. 8 which is representative of a 308 nm laser (laser fluence=0.7 J/cm$^2$ and pulse duration=40 ns). Specifically, this figure illustrates that heat generated by the laser annealing step of the present invention is limited to a relatively small distance from the surface of the substrate (0.4 $\mu$m). This provides controlled activation of the gate junction and the source/drain regions without causing any damage to the temperature sensitive material.

Figure 6:
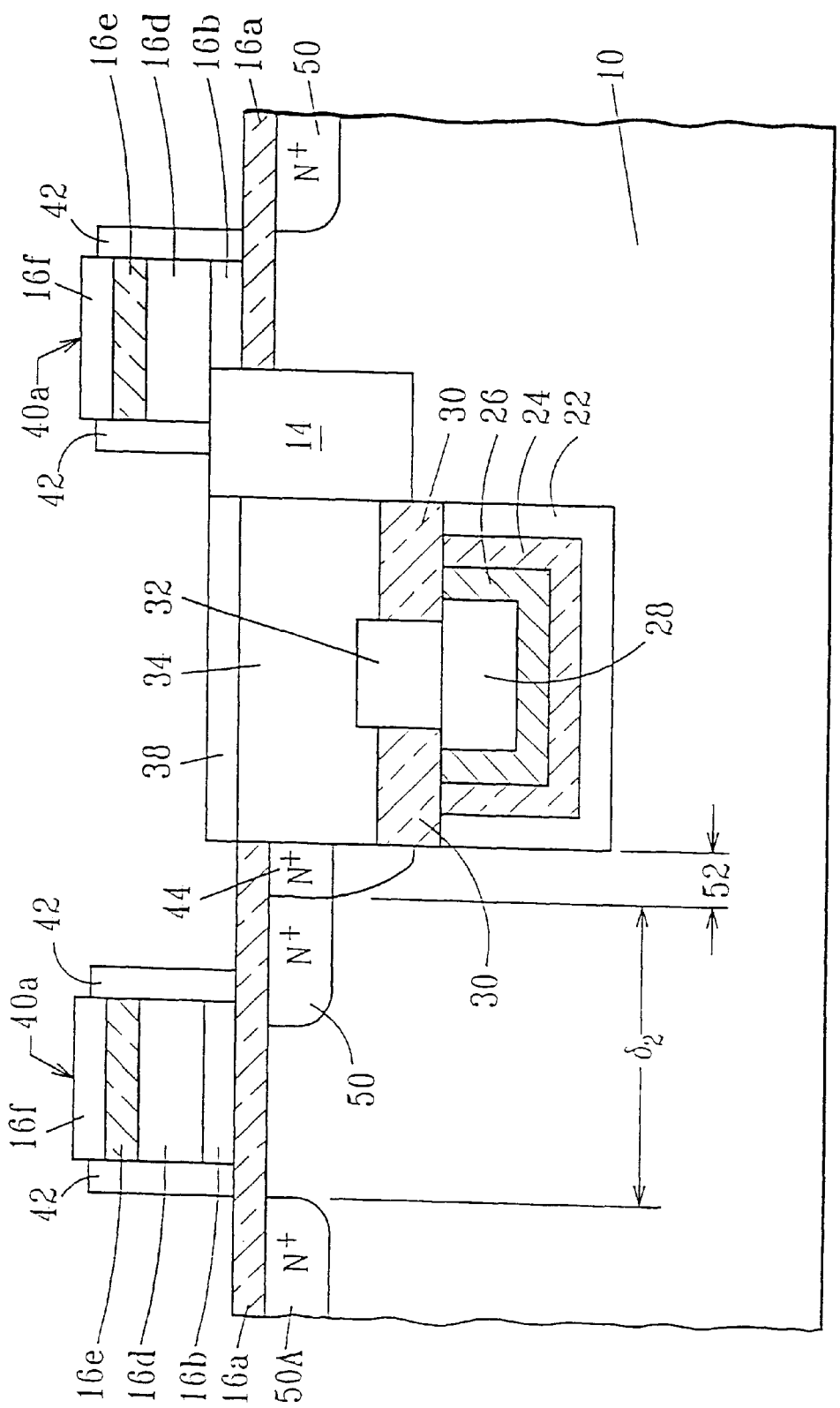
FIG. 6 shows the intermediate structure of FIG. 3 after ion implantation and excimer laser annealing.

Since the substrate is a good conductor of heat, there is still sufficient heat necessary to cause outdiffusion of the n+ type dopant from region 28 forming a limited buried-strap outdiffusion region 44. The limited buried outdiffusion region of the present invention has a lateral dimension 52 of less than 50 nm. More preferably, the lateral dimension 52 of the buried-strap is from about 15 to about 30 nm. The structure after source/drain formation and laser annealing is shown in FIG. 6. The excimer laser anneal step may be performed only once or additional excimer laser steps may be used. A single-pulse may be applied over a period of time or multiple pulses, i.e. train pulse, may be used over the same period of time.

In accordance with the present invention, the excimer laser annealing step is carried out using a laser having a wavelength at 308 nm (as produced by a XeCl source). The 308 nm laser is highly preferred since it produces a fluence which is particularly useful for the application of the invention. Other laser sources may also be useful, but their range of operability is limited by reduced fluence. For example, an ArF$_2$ source can produce a laser output of 193 nm, but the fluence is approximately half of that obtained from a XeCl source. Laser radiation at 248 nm may also be used in the present invention.

When a 308 nm laser source is employed, the laser is operated at a fluence of from about 500 to about 1100 mJ/cm$^2$ and a time duration of from about 25 to about 100 ns. More preferably, when a 308 nm laser is employed in the present invention, the 308 nm laser is operated at a fluence of from about 700 to about 1000 mJ/cm$^2$ and a time duration of from about 30 to about 60 ns.

Figure 7:
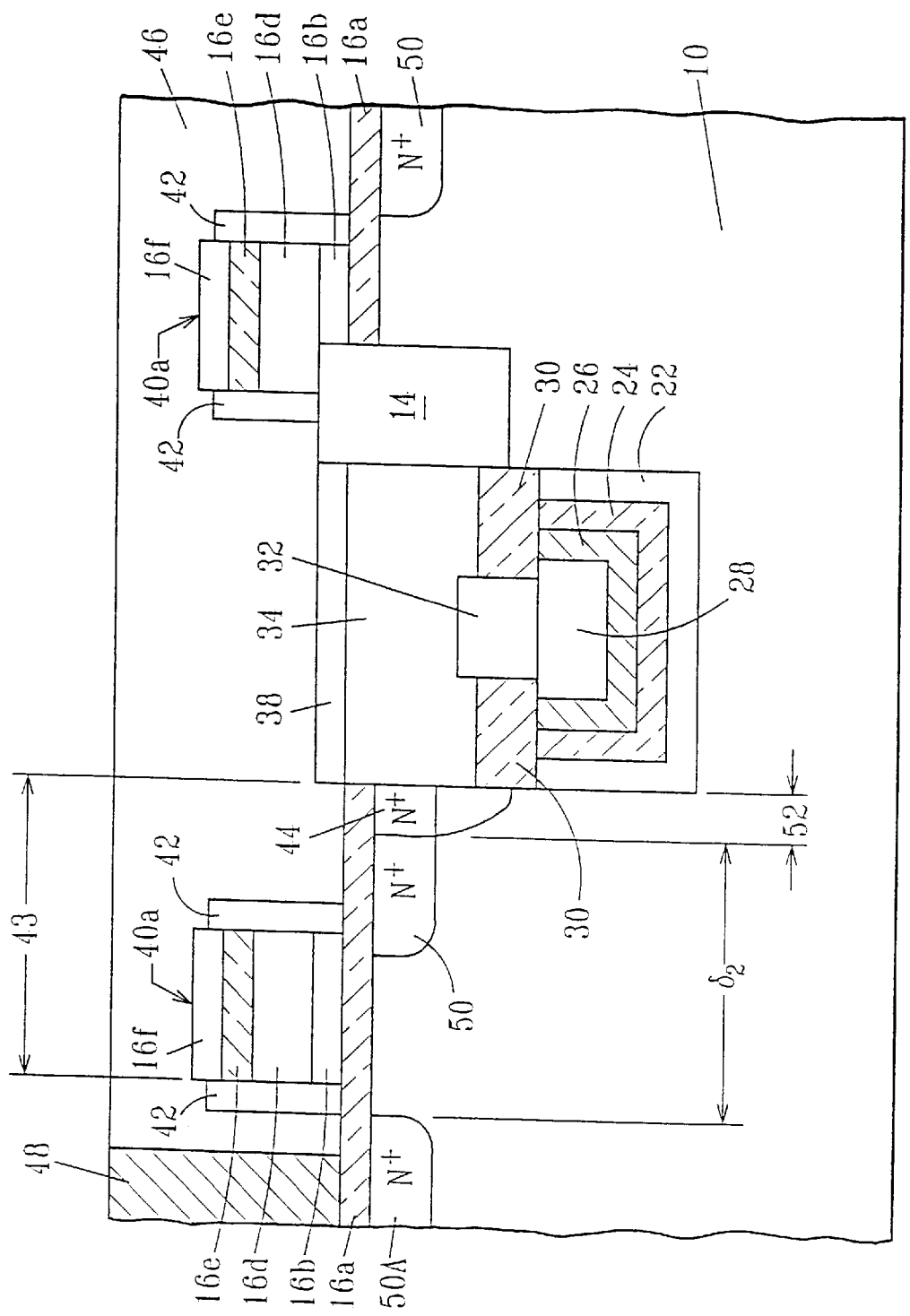
FIG. 7 shows the final trench storage capacitor structure of the present application.

An insulating layer 46 such a boron-phosphorus doped glass is deposited over the structure covering patterned gate conductor regions 40*a*, exposed gate oxide region 16*a*, and capacitor 36 using conventional deposition processes such as spin-on coating and chemical vapor deposition. Insulating layer 46 is then planarized using one of the aforementioned planarization techniques, and borderless diffusion contacts 48 are formed by standard lithography, dry etching, depositing a polysilicon layer and planarization. The final structure obtained in the present invention is shown in FIG. 7.

While the present invention has been particularly shown and described with respect to preferred embodiments thereof, it will be understood by those skilled in the art that the foregoing and other changes in form and detail may be made without departing from the spirit and scope of the present invention.

Having thus described our invention, what we claim as new, and desire to secure by the Letters Patent is:

1. A process of fabricating a trench capacitor semiconductor memory structure comprising the steps of:
    (a) providing an intermediate trench capacitor structure comprising a trench storage capacitor formed within a semiconductor substrate or wafer and a patterned gate region formed on said substrate or wafer, wherein said trench storage capacitor comprises at least a lower region having a temperature sensitive material situated between a bottom electrode and a top electrode and a doped polysilicon region formed on said top electrode;
    (b) forming source/drain regions in said semiconductor substrate or wafer in areas adjacent to said patterned gate region;
    (c) annealing the structure of step (b) using an excimer laser under conditions effective to activate the source/drain regions without substantially degrading the temperature sensitive material in said lower region of said storage capacitor and to cause substantial outdiffusion of dopant from said doped polysilicon region thereby forming a strap outdiffusion region in said substrate adjacent to said trench storage capacitor;
    (d) forming an insulating layer over said structure of step (c);
    (e) planarizing said insulating layer; and
    (f) forming borderless diffusion contacts on said semiconductor substrate or wafer.

2. The process of claim 1 wherein said temperature sensitive material is a material which may become unstable and also oxidize silicon when exposed to temperatures over 550° C. and has a dielectric constant of about 7 or higher.

3. The process of claim 2 wherein said temperature sensitive material has a dielectric constant of from about 20 to about 10,000.

4. The process of claim 1 wherein said temperature sensitive material is a material selected from the group consisting of barium strontium titanium oxide (BSTO), lead zirconium titanium oxide (PZTO), strontium bismuth tantalate (SBT) and Ta$_2$O$_5$.

5. The process of claim 4 wherein said temperature sensitive material is BSTO.

6. The process of claim 1 wherein said temperature sensitive material is formed by a deposition process selected from the group consisting of chemical vapor deposition and sputtering.

7. The process of claim 1 wherein said excimer laser is a 308 nm laser, a 193 nm laser or a 248 nm laser.

8. The process of claim 7 wherein said 308 nm excimer laser anneal step is operated at a fluence of from about 500 to about 1100 mJ/cm$^2$ and a pulse duration of about 25 to about 100 ns.

9. The process of claim 8 wherein said 308 nm excimer laser anneal step is operated at a fluence of from about 700 to about 1000 mJ/cm$^2$ and a pulse duration of about 30 to about 60 ns.

10. The process of claim 1 wherein said excimer laser anneal step is carried out using a single pulse or multiple pulses.

11. The process of claim 1 wherein said excimer laser anneal step is repeating any number of times.

12. The process of claim 1 wherein said semiconductor substrate or wafer is composed of a semiconductor material selected from the group consisting of Si, Ge, SiGe, GaAs, InAs, InP and all other III/V compounds.

13. The process of claim 12 wherein said semiconductor substrate or wafer is composed of Si.

14. The process of claim 1 wherein said semiconductor substrate or wafer contains at least one shallow trench isolation region abutting said trench storage capacitor region.

15. The process of claim 14 wherein said shallow trench isolation region includes a thermal silicon dioxide layer and a shallow trench isolation dielectric.

16. The process of claim 1 wherein said patterned gate region comprises a layer of polysilicon, another layer of polysilicon, a salicide layer and a cap layer, said layers formed on a gate oxide.

17. The process of claim 1 wherein said bottom and top electrodes are formed of the same or different conducting material selected from the group consisting of $RuO_2$, $SrRuO_3$, La—Sr—Co—O, $IrO_2$, Pt and Ir.

18. The process of claim 1 wherein said bottom and top electrodes are formed by a deposition process selected from the group consisting of chemical vapor deposition, metallo-organic chemical vapor deposition, electroplating and electrodeless plating.

19. The process of claim 1 wherein said pattern gate region further includes oxide spacers formed on the exterior sidewalls thereof.

20. The process of claim 1 wherein said excimer laser anneal step provides limited heating of said semiconductor substrate or wafer which is within 0.4 $\mu$m or less from the surface of said semiconductor substrate or wafer.

* * * * *